(12) United States Patent
Sun et al.

(10) Patent No.: US 11,777,512 B2
(45) Date of Patent: Oct. 3, 2023

(54) ANALOG-TO-DIGITAL CONVERTER CAPABLE OF CANCELLING SAMPLING NOISE

(71) Applicant: Tsinghua University, Beijing (CN)

(72) Inventors: Nan Sun, Beijing (CN); Jiaxin Liu, Beijing (CN)

(73) Assignee: Tsinghua University, Beijing (CN)

( * ) Notice: Subject to any disclaimer, the term of this patent is extended or adjusted under 35 U.S.C. 154(b) by 190 days.

(21) Appl. No.: 17/388,333

(22) Filed: Jul. 29, 2021

(65) Prior Publication Data

US 2021/0376846 A1    Dec. 2, 2021

Related U.S. Application Data

(63) Continuation of application No. PCT/CN2020/071167, filed on Jan. 9, 2020.

(30) Foreign Application Priority Data

Dec. 31, 2019    (CN) .......................... 201911423803.7

(51) Int. Cl.
 *H03M 1/12*    (2006.01)
 *H03M 1/08*    (2006.01)
 *H03M 1/46*    (2006.01)

(52) U.S. Cl.
 CPC .......... *H03M 1/08* (2013.01); *H03M 1/1245* (2013.01); *H03M 1/462* (2013.01); *H03M 1/466* (2013.01)

(58) Field of Classification Search
 CPC ........ H03M 1/08; H03M 1/466; H03M 1/468; H03M 3/426; H03M 1/38; H03M 1/0854;
 (Continued)

(56) References Cited

U.S. PATENT DOCUMENTS 6,243,034 B1 * 6/2001 Regier ................. H03M 1/145
                                                    341/166
8,659,460 B2 * 2/2014 Nani ..................... H03M 1/08
                                                    341/172
(Continued)

FOREIGN PATENT DOCUMENTS

CN    104467860 A    3/2015
WO    2017195911    11/2017

OTHER PUBLICATIONS

International Searching Authority, International Search Report dated Aug. 28, 2020, for Application No. PCT/CN2020/071167.
(Continued)

*Primary Examiner* — Linh V Nguyen
(74) *Attorney, Agent, or Firm* — Womble Bond Dickinson (US) LLP

(57) ABSTRACT

The present application discloses an analog-to-digital converter capable of cancelling sampling noise, which comprises: a sampling circuit configured to acquire an analog input signal; a sampling noise cancelling circuit has an input end connected with an output end of the sampling circuit, and is configured to cancel noise generated by the sampling circuit; a comparator has an input end connected with an output end of the sampling noise cancelling circuit, and an output end connected with an input end of a logic circuit, and is configured to compare magnitudes of output signals of the sampling noise cancelling circuit and output a comparison result to the logic circuit; and the logic circuit has an output end connected with the sampling circuit, and is configured to output a digital output signal, and process the comparison result to obtain a control signal by which an output voltage of the sampling circuit is controlled.

4 Claims, 2 Drawing Sheets

(58) Field of Classification Search
CPC ... H03M 1/462; H03M 1/1009; H03M 1/1245
USPC .......................... 341/118, 120, 150, 155, 172
See application file for complete search history.

(56) References Cited

U.S. PATENT DOCUMENTS

| | | | |
|---|---|---|---|
| 8,786,483 B1* | 7/2014 | Thompson | H03M 1/0836 |
| | | | 341/161 |
| 9,774,345 B1* | 9/2017 | Yoshioka | H03M 1/0854 |
| 11,043,957 B2* | 6/2021 | Nakamoto | H03F 3/45475 |
| 2011/0128172 A1* | 6/2011 | Srinivasa | H03M 1/002 |
| | | | 341/172 |
| 2012/0105262 A1* | 5/2012 | Rao | H03M 1/123 |
| | | | 341/155 |
| 2014/0210654 A1* | 7/2014 | Segawa | H03M 1/1245 |
| | | | 341/122 |
| 2019/0131989 A1* | 5/2019 | Maurino | H03M 1/08 |
| 2019/0207620 A1* | 7/2019 | Lee | H03M 3/494 |

OTHER PUBLICATIONS

Liu et al. "A 0.46mW 5MHz-BW 79.7dB-SNDR Noise-Shaping SAR ADC with Dynamic-Amplifier-Based FIR-IIR Filter", IEEE ISSCC Dig. Tech. papers, San Francisco, CA, USA, Feb. 8, 2017.
Liu, "Research on Key Techniques of Noise-Shaping Based Energy-Efficient Analog-to-Digital Converters", Doctoral Dissertations, Apr. 15, 2019.

* cited by examiner

ANALOG-TO-DIGITAL CONVERTER CAPABLE OF CANCELLING SAMPLING NOISE

CROSS-REFERENCE TO RELATED APPLICATIONS

This application is a continuation of International Application No. PCT/CN2020/071167, entitled "Analog-to-digital Converter Capable of Offsetting Sampling Noise", filed on Jan. 9, 2020, which claims priority to Chinese Patent Application entitled "Analog-to-digital Converter Capable of Cancelling Sampling Noise" filed by Tsinghua University on Dec. 31, 2019, with the Application No. 201911423803.7. The disclosures of the aforementioned applications are hereby incorporated by reference in their entireties.

TECHNICAL FIELD

The present application belongs to the technical field of integrated circuit design, and particularly to an analog-to-digital converter capable of cancelling sampling noise.

BACKGROUND

An analog-to-digital converter (ADC) is an electronic device that can convert analog signals in the real world into digital signals in an electronic system. A successive approximation register (SAR) ADC is an ADC structure with low power consumption, which is widely used in fields such as the Internet of Things, wearable devices, implantable medical electronics and so on.

In the electronic system, an input signal of the SAR ADC is provided by an input driver in a stage preceding to the SAR ADC. A reference signal required during the conversion of the SAR ADC is provided by a reference buffer in the g stage preceding to the SAR ADC, as shown in FIG. 1. The input driver and the reference buffer constitute a driving circuit of the SAR ADC. A load of the driving circuit is a sampling capacitor in the SAR ADC.

The SAR ADC may introduce sampling noise when sampling the input signal. The sampling noise is a basic factor limiting the ADC accuracy. In order to reduce the sampling noise and improve the accuracy, it is necessary to increase the sampling capacitor. The large sampling capacitor brings about a great burden to the driving circuit of the ADC. In order to drive the large sampling capacitor, it is necessary to increase power consumption, an area and design complexity of the driving circuit so as to improve its driving capacity.

A circuit structure of a single-terminal form of the existing SAR ADC is shown in FIG. 2(a). The corresponding working flow is shown in FIG. 2(b). To simplify the expression, the logic circuit is not shown in FIG. 2(b), and a capacitor array is simplified in a form of a single capacitor.

The time period from $t_0$ to $t_1$ is a sampling process, switches $\Phi_1$ and $\Phi_2$ are on, an upper plate of sampling capacitor array $C_1$ is grounded, and a lower plate is connected with an input signal $V_{in}$; and since the sampling switch has thermal noise, the input signal $V_{in}$ and the thermal noise $v_{ns1}$ of the switch are sampled together onto the capacitor $C_1$.

At the time $t_1$, the sampling is ended, the sampling switch is off, and voltage stored on two ends of $C_1$ is $V_{in}(t_1)+v_{ns1}$.

After the sampling, a conversion process of the ADC begins, a comparator performs the comparisons for multiple times, and the logic circuit feeds a result of each comparison back to the lower plate of the sampling capacitor array, so that the voltage on the input end of the comparator is approximate to 0. After the conversion process of the ADC, an equivalent signal of the lower plate of the capacitor array $C_1$ is a digital output signal $D_{out}$, and the voltage on the input end of the comparator is 0 in a case where other non-ideal factors are not considered.

In the conversion process of the ADC, the voltage on two ends of the capacitor array $C_1$ is kept invariably at $V_{in}+v_{ns1}$. According to the charge conservation law, formula (1) may obtained as follows:

$$D_{out}=V_{in}+v_{ns1} \qquad (1)$$

It can be seen that except for the signal, the sampling noise $v_{ns1}$ also presents directly in an expression of the input signal $D_{out}$, thereby reducing a signal-to-noise ratio of an output result.

A variance of the sampling noise is inversely proportional to a sampling capacitance value, which can be expressed by the following formula (2):

$$v_{ns1}^2=kT/C_1 \qquad (2)$$

In the formula, k is a Boltzmann constant, and T is an absolute temperature.

With respect to the SAR ADC shown in FIG. 2, the only method for reducing the sampling noise is to increase the capacitance value of the sampling capacitor $C_1$.

It can be seen that the sampling noise directly limits the signal-to-noise ratio of the ADC. The only way for reducing the sampling noise and increasing the signal-to-noise ratio is to increase the capacitance value of the capacitor. However, increasing the capacitance value of the sampling capacitor may bring great cost to the circuit design. The sampling capacitor is a load of the driving circuit in the preceding stage. The large sampling capacitor brings a large load to the driving circuit of the ADC. In order to drive a large sampling capacitor, it is necessary to increase power consumption, an area and design complexity of the driving circuit so as to improve its driving capacity.

SUMMARY

The present application is directed to solve one of the technical problems in the prior art to a certain extent.

Therefore, an objective of the present application is to provide an analog-to-digital converter capable of cancelling sampling noise. The analog-to-digital converter can cancel the noise introduced by a sampling operation, so that a small sampling capacitor may be used in the ADC without causing signal-to-noise ratio loss, and the power consumption, area and design complexity of the driving circuit may be reduced.

To achieve the above objective, an embodiment of the present application provides an analog-to-digital converter capable of cancelling sampling noise, which includes a sampling circuit, a sampling noise cancelling circuit, a comparator and a logic circuit.

The sampling circuit is configured to acquire an analog input signal.

An input end of the sampling noise cancelling circuit is connected with an output end of the sampling circuit, and the sampling noise cancelling circuit is configured to cancel noise generated by the sampling circuit.

The comparator has an input end connected with an output end of the sampling noise cancelling circuit, and an output end connected with an input end of the logic circuit; and the comparator is configured to compare magnitudes of output signals of the sampling noise cancelling circuit and output a comparison result to the logic circuit.

An output end of the logic circuit is connected with the sampling circuit, and the logic circuit is configured to output a digital output signal, process the comparison result to obtain a control signal and control an output voltage of the sampling circuit according to the control signal.

The analog-to-digital converter capable of cancelling sampling noise of the present embodiment adds a sampling noise cancelling circuit between the sampling circuit and the comparator, which may cancel the noise generated by the sampling circuit, so that a small sampling capacitor may be used in the ADC without causing signal-to-noise ratio loss, and the reduction of the sampling capacitor lowers the requirement on the driving capacity of the driving circuit, thereby reducing the power consumption, area and design complexity of the driving circuit.

Furthermore, the analog-to-digital converter capable of cancelling the sampling noise according to the above embodiment of the present application may further have the following additional technical features:

Further, in an embodiment of the present application, the sampling circuit includes a first sampling capacitor array, a first switch and a second switch;

The sampling noise cancelling circuit includes an amplifier, a second capacitor and a third switch;

The first sampling capacitor array has a lower plate connected separately with one end of the second switch and a reference voltage or the logic circuit, and an upper plate connected separately with one end of the first switch and an input end of the amplifier, the other end of the first switch is grounded or connected with a DC voltage, and the other end of the second switch is connected with the analog input signal;

The amplifier has an input end connected with one end of the first switch, and an output end connected with a lower plate of the second capacitor;

An upper plate of the second capacitor is connected separately with one end of the third switch and an input end of the comparator, and the other end of the third switch is grounded or connected with a DC voltage.

Further, in an embodiment of the present application, a falling edge of the third switch is later than the first switch and earlier than the second switch.

Further, in an embodiment of the present application, the first switch and the third switch are grounded; and in a time period of $t_0$-$t_1$, the first switch, the second switch and the third switch are on, the analog input signal is followed and stored on the first sampling capacitor array, the input end of the amplifier and the upper plate of the second capacitor are grounded, and voltage on two ends of the second capacitor is cleared;

At the time $t_1$, the first switch is off, and the input signal $V_{in}(t_1)$ at the time $t_1$ and the sampling noise $v_{ns1}$ are stored together on the first sampling capacitor array; and the upper plate side of the first sampling capacitor array forms an open circuit (i.e., is open), and the voltage on two ends of the first sampling capacitor array is always kept at $V_{in}(t_1)+v_{ns1}$;

In a time period of $t_1$-$t_2$, the first switch is in an off state, the third switch is in an on state, the input signal $V_{in}$ in the time period of $t_1$-$t_2$ is still connected with the lower plate of the first sampling capacitor array, the voltage on two ends of the first sampling capacitor is kept unchanged, the voltage on the input end of the amplifier is a difference between Vin and the voltage on two ends of the first sampling capacitor array i.e., $V_{in}$-$V_{in}(t_1)$-$v_{ns1}$, this voltage is amplified by A times and then stored on the capacitor $C_2$, where A is a gain of the amplifier;

At the time $t_2$, the third switch is off, the noise $V_{ns2}$ of the third switch is fixed on the second capacitor, the input signal at the time $t_2$ is $V_{in}(t_2)$, and a total voltage amount collected on the second capacitor is $A\cdot[V_{in}(t_2)-V_{in}(t_1)-v_{ns1}]+v_{ns2}$;

After the time $t_2$, a conversion process of the analog-to-digital converter begins, the comparator performs the comparison for multiple times, and the logic circuit feeds a comparison result at each time back to the lower plate of the first sampling capacitor array, so that the voltage on the input end of the comparator is approximate to 0; at the time when the conversion is ended, an equivalent signal of the lower plate of the first sampling capacitor array is the digital output signal $D_{out}$; and since the voltage on the input end of the comparator is 0 at the end of conversion, the digital output signal $D_{out}$ can be obtained as:

$$D_{out}=V_{in}(t_2)+v_{ns2}/A.$$

Further, in an embodiment of the present application, the analog-to-digital converter includes but is not limited to a successive approximation register analog-to-digital converter.

Additional aspects and advantages of the present application are partially described below, and part of them may become apparent in the following description or may be known by the practice of the present application.

BRIEF DESCRIPTION OF THE DRAWINGS

The above and/or additional aspects and advantages of the present application become apparent and easily understood from the following description of the embodiments in combination with the accompanying drawings.

DETAILED DESCRIPTION

Figure 1:
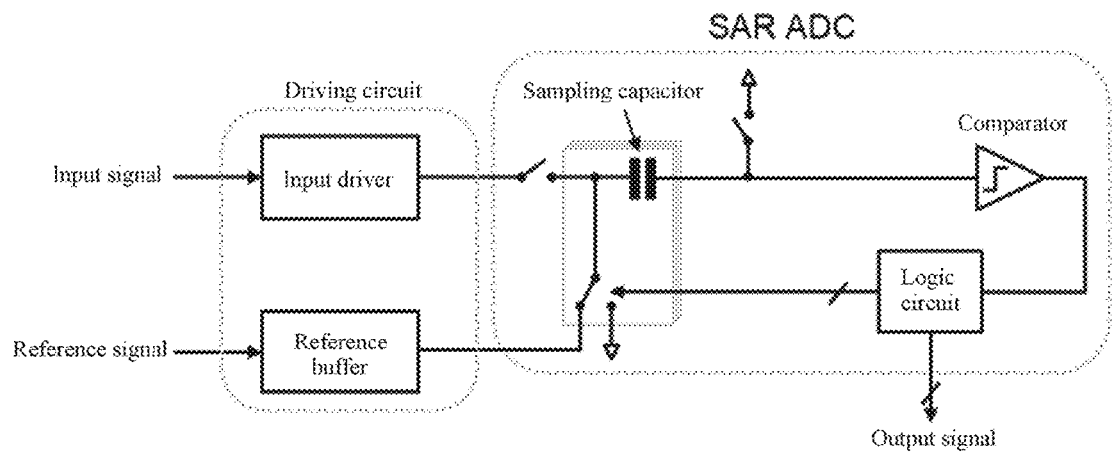
FIG. 1 is a structural schematic diagram of an SAR ADC and a driving circuit in a stage preceding to the SAR ADC.
Figure 2:
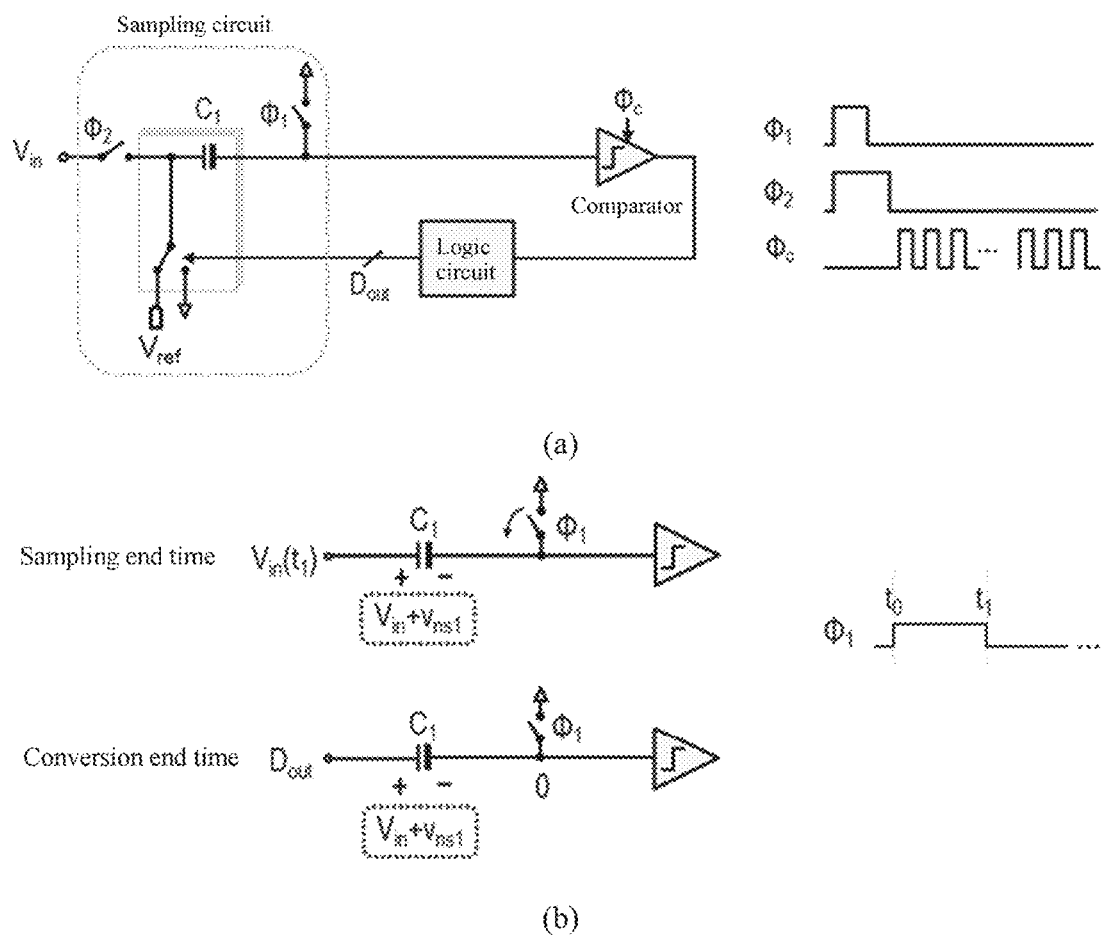
FIG. 2 is a structural schematic diagram of the existing SAR ADC.

Embodiments of the present application are described below in detail. Examples of the embodiments are shown in the accompanying drawings, wherein same or similar reference numerals indicate the same or similar elements or elements having the same or similar functions. The embodiments described below with reference to the accompanying drawings are exemplary and are intended to explain the present application, but should not be construed as limiting the present application.

An analog-to-digital converter capable of cancelling sampling noise provided according to an embodiment of the present application is described below with reference to the accompanying drawings.

Taking a successive approximation register (SAR) analog-to-digital converter as an example, the analog-to-digital converter capable of cancelling the sampling noise of the present application is introduced.

Figure 3:
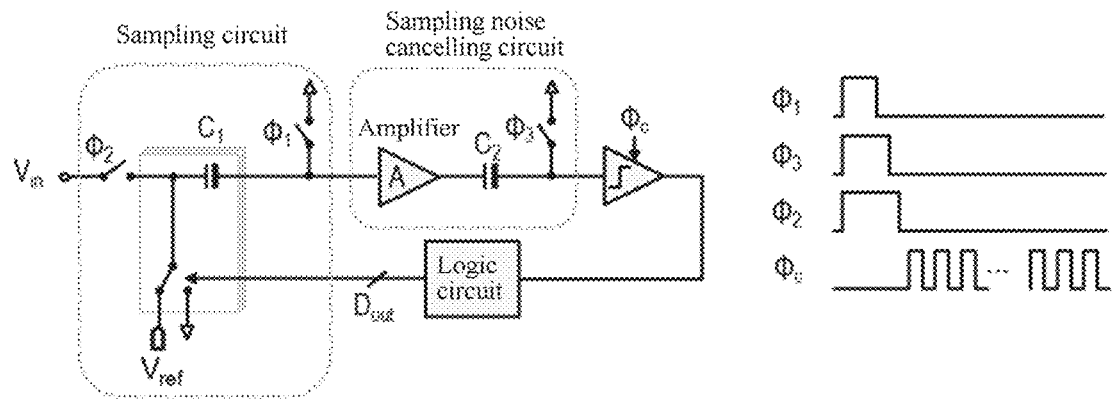
FIG. 3 is a structural schematic diagram of an analog-to-digital converter capable of cancelling sampling noise according to an embodiment of the present application.

FIG. 3 is a structural schematic diagram of an analog-to-digital converter capable of cancelling sampling noise according to an embodiment of the present application.

As shown in FIG. 3, the analog-to-digital converter capable of cancelling the sampling noise includes a sampling circuit, a sampling noise cancelling circuit, a comparator and a logic circuit.

The sampling circuit is configured to acquire an analog input signal.

An input end of the sampling noise cancelling circuit is connected with an output end of the sampling circuit. The sampling noise cancelling circuit is configured to cancel noise generated by the sampling circuit.

The comparator has an input end connected with an output end of the sampling noise cancelling circuit, and an output end connected with an input end of the logic circuit; and the comparator is configured to compare magnitudes of output signals of the sampling noise cancelling circuit and output a comparison result to the logic circuit.

An output end of the logic circuit is connected with the sampling circuit, and the logic circuit is configured to output the digital output signal, and process the comparison result to obtain a control signal, and an output voltage of the sampling circuit controlled according to the control signal.

Further, the sampling circuit includes a first sampling capacitor array, a first switch and a second switch;

The sampling noise cancelling circuit includes an amplifier, a second capacitor and a third switch;

The first sampling capacitor array has a lower plate connected separately with one end of the second switch and a reference voltage or the logic circuit, and an upper plate connected separately with one end of the first switch and an input end of the amplifier, the other end of the first switch is grounded or connected with a DC voltage, and the other end of the second switch is connected with the analog input signal.

The input end of the amplifier is connected with the one end of the first switch, and an output end of the amplifier is connected with a lower plate of the second capacitor.

An upper plate of the second capacitor is connected separately with one end of the third switch and the input end of the comparator, and the other end of the third switch is grounded or connected with a DC voltage.

It may be understood that the present embodiment of the present application adds a sampling noise cancelling circuit between the sampling circuit and the comparator. The sampling noise cancelling circuit includes one amplifier, one capacitor $C_2$ and one switch $\Phi_3$.

Further, a falling edge of the third switch $\Phi_3$ is later than that of the first switch $\Phi_1$ and earlier than that of the second switch $\Phi_2$.

In the present solution, the falling edge of the switch $\Phi_3$ is later than that of $\Phi_1$ and earlier than that of $\Phi_2$. The sampling noise generated by the sampling switch $\Phi_1$ is stored in the sampling capacitor array $C_1$ on one hand, and may also be stored in $C_2$ after being amplified by the amplifier on the other hand. The sampling noises in $C_1$ and $C_2$ have opposite polarities and may cancel each other. Although the added switch $\Phi_3$ may introduce additional sampling noise, the noise may be attenuated greatly by the gain of the amplifier. Therefore, compared with the prior art, by using the present solution, the total amount of the sampling noise in the ADC system may be reduced greatly.

Figure 4:
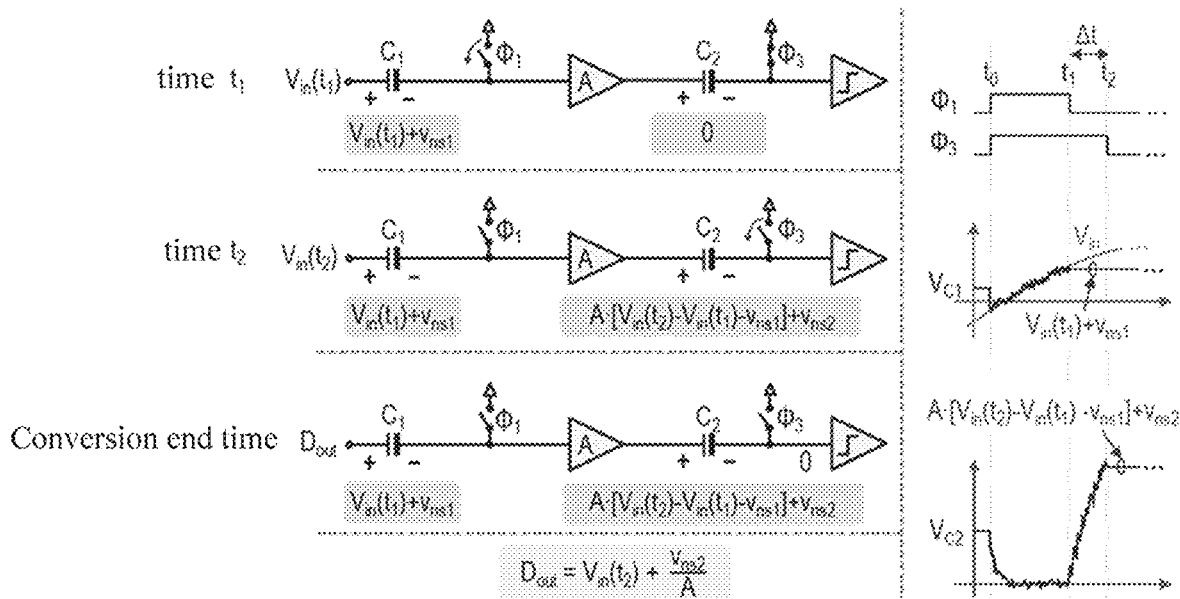
FIG. 4 is structural schematic diagram of the analog-to-digital converter capable of cancelling sampling noise in different phases according to an embodiment of the present application.

As shown in FIG. 4, a working principle of the SAR ADC of the present solution is described below. To simplify the expression, the logic circuit and the switch 12 are omitted in the drawing, and the first switch and the third switch are grounded.

In a time period of $t_0$-$t_1$, $\Phi 1$, $\Phi 2$ and $\Phi 3$ all are on, and the analog input signal is followed and stored on the capacitor array $C_1$; and meanwhile, the input end of the amplifier and the upper plate of the capacitor $C_2$ are grounded, so the voltage on two ends of the capacitor $C_2$ is cleared.

At the time $t_1$, $\Phi_1$ is off, and the input signal $V_{in}(t_1)$ at this time and the sampling noise $v_{ns1}$ of the switch are stored together on the capacitor array $C_1$. Thereafter, since the upper plate side of the $C_1$ is open, there is no charging-discharging path, because the voltage on two ends of the $C_1$ is always kept at $V_{in}(t_1)+v_{ns1}$.

In the time period of $t_1$-$t_2$, $\Phi_1$ is in an off state, and $\Phi_3$ is still in an on state. The input signal $V_{in}$ at this time is still connected with the lower plate of $C_1$, and the voltage on two ends of $C_1$ is kept unchanged, so the voltage on the input end of the amplifier is a difference between $V_{in}$ and the voltage on two ends of $C_1$, i.e., $V_{in}$−$V_{in}(t_1)$−$v_{ns1}$, and this voltage is amplified by A times and then stored on the capacitor $C_2$, where A is a gain of the amplifier.

At the time $t_2$, $t_3$ is off, and the noise $v_{ns2}$ of the switch $\Phi_3$ is fixed on the capacitor $C_2$. At this time, the input signal is $V_{in}(t_2)$, so a total voltage acquired by the capacitor $C_2$ is $A \cdot [V_{in}(t_2)-V_{in}(t_1)-V_{ns1}]+V_{ns2}$.

After the time $t_2$, a conversion process of the ADC begins, the comparator performs comparisons for multiple times, and the logic circuit feeds a result of each comparison back to the lower plate of the sampling capacitor array, so that the voltage on the input end of the comparator is approximate to 0. At the time when the conversion is ended, an equivalent signal of the lower plate of the capacitor array $C_1$ is the digital output signal $D_{out}$. Since the voltage on the input end of the comparator is 0 at the end of conversion, the digital output signal $D_{out}$ can be obtained as:

$$D_{out}=V_{in}(t_2)+v_{ns2}/A \qquad (3)$$

In the above formula, a variance $v_{ns1}^2$ of the noise $v_{ns2}$ introduced by the switch $\Phi_3$ is $kT/C_2$.

Comparing the formula (1) and formula (3), it may be seen that through the present solution, the sampling noise $v_{ns1}$ is cancelled, and the noise $v_{ns2}$ introduced by the switch $\Phi_3$ is attenuated by the gain of the amplifier, which is reduced by A times. Therefore, the SAR ADC proposed by the present solution may adopt a small sampling capacitor $C_1$ to lower the requirement on the driving capacity of the driving circuit, thereby reducing greatly the power consumption, area and design complexity.

In conclusion, the sampling noise cancelling circuit is used in the successive approximation register analog-to-digital converter, which may cancel the noise generated by the sampling circuit. The sampling noise cancelling circuit of the present embodiment is not limited to the application in the successive approximation register analog-to-digital converter, and may still be suitable for other analog-to-digital converters.

The above description is a single-terminal circuit structure of the ADC. It should be noted that the embodiment of the present application is also suitable for the ADC of a differential circuit structure.

Further, during the period when the first switch and the third switch are on, the upper plate of the capacitor is grounded. In practical circuit design, the upper plate of the capacitor may be connected to any DC voltage according to the requirement.

The analog-to-digital converter capable of cancelling the sampling noise according to the present embodiment adds a sampling noise cancelling circuit between the sampling circuit and the comparator, which may cancel the noise generated by the sampling circuit, so that a small sampling capacitor may be used in the ADC without causing signal-to-noise ratio loss, and the reduction of the sampling capacitor lowers the requirement on the driving capacity of the driving circuit, thereby reducing the power consumption, area and design complexity of the driving circuit.

In the description of the present application, it should be understood that an orientation or positional relationship indicated by terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. is based on the orientation or positional relationship shown in the drawings, and is only for convenience in describing the present application and simplifying the description, rather than indicating or implying specified devices or elements must have a specific orientation or must be constructed and operated in a specific orientation, and therefore cannot be understood as a limitation to the present application.

In addition, terms "first" and "second" are only for the purpose of description, and cannot be understood as indicating or implying relative importance or implicitly indicating the number of indicated technical features. Therefore, features defined with "first" and "second" may explicitly or implicitly include at least one of the features. In the description of the present application, "a plurality of" means at least two, for example, two or three, etc.

In the present application, unless otherwise defined and limited clearly, the terms "mount", "connected", "connection" and "fixed" should be understood in a broad sense, for example, it may be a fixed connection, a detachable connection, or an integral connection; it may be a mechanical connection or an electrical connection; and it may be a direct connection or an indirect connection through an intermediate medium, and may also be an internal communication of two elements or an interaction relationship of two elements, unless otherwise specified. For those ordinarily skilled in the art, the specific meaning of the above terms in the present application may be understood in specific circumstances.

In the present application, unless otherwise specified or defined clearly, the first feature is "on" or "under" the second feature, which may refer to that the first feature and the second feature are in direct contact, or the first feature and the second feature are in indirect contact through an intermediate medium. Moreover, the first feature is "on" and "above" the second feature, which may refer to that the first feature is directly above or obliquely above the second feature, or only refers to that a level of the first feature is higher than the second feature. Moreover, the first feature is "below" and "under" the second feature, which may refer to that the first feature is directly below or obliquely below the second feature, or only refers to that the level of the first feature is lower than the second feature.

In the description of the present application, descriptions with reference to terms "one embodiment", "some embodiments", "examples", "specific examples", or "some examples" etc. mean specific features, structures, materials, or characteristics described in conjunction with the embodiment(s) or example(s) are contained in at least one embodiment or example of the present application. In the present specification, the schematic representations of the above terms are not necessary for the same embodiment(s) or example(s). Moreover, the described specific features, structures, materials or characteristics may be combined in an appropriate way in any or more embodiments or examples. Furthermore, different embodiments or examples and features of different embodiments or examples described in the present specification may be combined by those skilled in the art without contradicting each other.

Although the embodiments of the present application have been shown and described above, it may be understood that the above embodiments are exemplary and should not be construed as limiting the present application. Changes, modifications, replacements or variations may be made by those skilled in the art for the above embodiments within the scope of the present application.

What is claimed is:

1. An analog-to-digital converter capable of cancelling sampling noise, comprising:
    a sampling circuit, a sampling noise cancelling circuit, a comparator and a logic circuit, wherein
    the sampling circuit is configured to acquire an analog input signal;
    the sampling noise cancelling circuit has an input end connected with an output end of the sampling circuit, and is configured to cancel noise generated by the sampling circuit;
    the comparator has an input end connected with an output end of the sampling noise cancelling circuit, and an output end connected with an input end of the logic circuit, and the comparator is configured to compare magnitudes of output signals of the sampling noise cancelling circuit and output a comparison result to the logic circuit;
    the logic circuit has an output end connected with the sampling circuit, and is configured to output a digital output signal, and configured to process the comparison result to obtain a control signal by which an output voltage of the sampling circuit is controlled;
    the sampling circuit includes a first sampling capacitor array, a first switch and a second switch;
    the sampling noise cancelling circuit includes an amplifier, a second capacitor and a third switch;
    the first sampling capacitor array has a lower plate connected respectively with one end of the second switch and one of a reference voltage or the logic circuit, and an upper plate connected separately with one end of the first switch and an input end of the amplifier, the other end of the first switch is grounded or connected with a DC voltage, and the other end of the second switch is connected with the analog input signal;
    the input end of the amplifier is connected with the one end of the first switch, and an output end of the amplifier is connected with a lower plate of the second capacitor;
    an upper plate of the second capacitor is connected separately with one end of the third switch and the input end of the comparator, and the other end of the third switch is grounded or connected with a DC voltage; and
    a falling edge of the third switch is later than that of the first switch and earlier than that of the second switch.

2. An analog-to-digital converter capable of cancelling sampling noise, comprising:
    a sampling circuit, a sampling noise cancelling circuit, a comparator and a logic circuit, wherein
    the sampling circuit is configured to acquire an analog input signal;

the sampling noise cancelling circuit has an input end connected with an output end of the sampling circuit, and is configured to cancel noise generated by the sampling circuit;

the comparator has an input end connected with an output end of the sampling noise cancelling circuit, and an output end connected with an input end of the logic circuit, and the comparator is configured to compare magnitudes of output signals of the sampling noise cancelling circuit and output a comparison result to the logic circuit;

the logic circuit has an output end connected with the sampling circuit, and is configured to output a digital output signal, and configured to process the comparison result to obtain a control signal by which an output voltage of the sampling circuit is controlled;

the sampling circuit includes a first sampling capacitor array, a first switch and a second switch;

the sampling noise cancelling circuit includes an amplifier, a second capacitor and a third switch;

the first sampling capacitor array has a lower plate connected respectively with one end of the second switch and one of a reference voltage or the logic circuit, and an upper plate connected separately with one end of the first switch and an input end of the amplifier, the other end of the first switch is grounded or connected with a DC voltage, and the other end of the second switch is connected with the analog input signal;

the input end of the amplifier is connected with the one end of the first switch, and an output end of the amplifier is connected with a lower plate of the second capacitor;

an upper plate of the second capacitor is connected separately with one end of the third switch and the input end of the comparator, and the other end of the third switch is grounded or connected with a DC voltage;

the first switch and the third switch are grounded; and in a time period of $t_0$-$t_1$, the first switch, the second switch and the third switch are on, the analog input signal is followed and stored on the first sampling capacitor array, the input end of the amplifier and the upper plate of the second capacitor are grounded, and a voltage across the second capacitor is cleared;

at the time $t_1$, the first switch is off, and the input signal at the time $t_1$ $V_{in}(t_1)$ and the sampling noise $v_{ns1}$ are stored together on the first sampling capacitor array; and the upper plate of the first sampling capacitor array is open, and a voltage across the first sampling capacitor array is kept constantly at $V_{in}(t_1)+v_{ns1}$;

in a time period of $t_1$-$t_2$, the first switch is in an off state, the third switch is in an on state, the input signal $V_{in}$ in the time period of $t_1$-$t_2$ is still connected with the lower plate of the first sampling capacitor array, the voltage across the first sampling capacitor is kept unchanged, and a voltage on the input end of the amplifier is a difference between $V_{in}$ and the voltage across the first sampling capacitor array, i.e., $V_{in}$-$V_{in}(t_1)$-$v_{ns1}$, and is amplified by A times and then stored on the capacitor C2, wherein A is a gain of the amplifier;

at the time $t_2$, the third switch is off, a noise $V_{ns2}$ of the third switch is fixed on the second capacitor, the input signal at the time $t_2$ is $V_{in}(t_2)$, and a total voltage acquired by the second capacitor is $A \cdot [V_{in}(t_2)-V_{in}(t_1)-v_{ns1}]+v_{ns2}$;

after the time $t_2$, a conversion process of the analog-to-digital converter begins, the comparator performs comparisons for multiple times, and the logic circuit feeds a result of each comparison back to the lower plate of the first sampling capacitor array, so that a voltage on the input end of the comparator is pulled down towards 0; and at a time when the conversion is ended, an equivalent signal at the lower plate of the first sampling capacitor array is the digital output signal $D_{out}$; and since the voltage on the input end of the comparator is 0 at the end of conversion, the digital ouput signal $D_{out}$ can be obtained as $$D_{out}=V_{in}(t_2)+v_{ns2}/A.$$

3. The analog-to-digital converter capable of cancelling the sampling noise according to 1, wherein the analog-to-digital converter includes but is not limited to a successive approximation register analog-to-digital converter.

4. The analog-to-digital converter capable of cancelling the sampling noise according to claim 2, wherein the analog-to-digital converter includes but is not limited to a successive approximation register analog-to-digital converter.

* * * * *